(12) United States Patent
Shin

(10) Patent No.: US 8,981,450 B2
(45) Date of Patent: Mar. 17, 2015

(54) SEMICONDUCTOR DEVICE AND METHOD OF MANUFACTURING THE SAME

(71) Applicant: SK hynix Inc., Icheon-si Gyeonggi-do (KR)

(72) Inventor: Dae Gyu Shin, Yongin-si (KR)

(73) Assignee: SK Hynix Inc., Gyeonngi-do (KR)

( * ) Notice: Subject to any disclaimer, the term of this patent is extended or adjusted under 35 U.S.C. 154(b) by 0 days.

(21) Appl. No.: 13/718,460

(22) Filed: Dec. 18, 2012

(65) Prior Publication Data

US 2014/0110774 A1    Apr. 24, 2014

(30) Foreign Application Priority Data

Oct. 18, 2012   (KR) .......................... 10-2012-0116175

(51) Int. Cl.
| | | |
|---|---|---|
| *H01L 27/11* | (2006.01) | |
| *H01L 29/792* | (2006.01) | |
| *H01L 29/66* | (2006.01) | |
| *H01L 21/28* | (2006.01) | |
| *H01L 29/51* | (2006.01) | |
| *H01L 27/115* | (2006.01) | |

(52) U.S. Cl.
CPC ........ *H01L 29/792* (2013.01); *H01L 29/66833* (2013.01); *H01L 21/28* (2013.01); *H01L 29/51* (2013.01); *H01L 27/11524* (2013.01); *H01L 27/11556* (2013.01); *H01L 27/1157* (2013.01); *H01L 27/11582* (2013.01)

USPC ..... 257/315; 257/316; 257/319; 257/E29.309

(58) Field of Classification Search
CPC ..................... H01L 29/7926; H01L 27/11578; H01L 27/11582
USPC ........... 257/315, 316, 319–321, 324, E29.309
See application file for complete search history.

(56) References Cited

U.S. PATENT DOCUMENTS

| | | | |
|---|---|---|---|
| 7,919,806 B2 * | 4/2011 | Fujiwara et al. | 257/314 |
| 2010/0244119 A1 * | 9/2010 | Fukuzumi et al. | 257/324 |
| 2011/0266612 A1 * | 11/2011 | Kikuchi et al. | 257/326 |

FOREIGN PATENT DOCUMENTS

| | | |
|---|---|---|
| KR | 1020100038976 A | 4/2010 |
| KR | 10-1117349 B1 | 2/2012 |

\* cited by examiner

*Primary Examiner* — Roy Potter
*Assistant Examiner* — Paul Patton
(74) *Attorney, Agent, or Firm* — William Park & Associates Patent Ltd.

(57) ABSTRACT

A semiconductor device includes conductive layers and interlayer insulating layers stacked alternately with each other, at least one first channel layer passing through the conductive layers and the interlayer insulating layers, at least one second channel layer coupled to the first channel layers and passing through the conductive layers and the interlayer insulating layers, a first insulating layer interposed between the at least one first channel layer and the conductive layers, and a second insulating layer interposed between the at least one second channel layer and the conductive layers and having a higher nitrogen concentration than the first insulating layer.

20 Claims, 5 Drawing Sheets

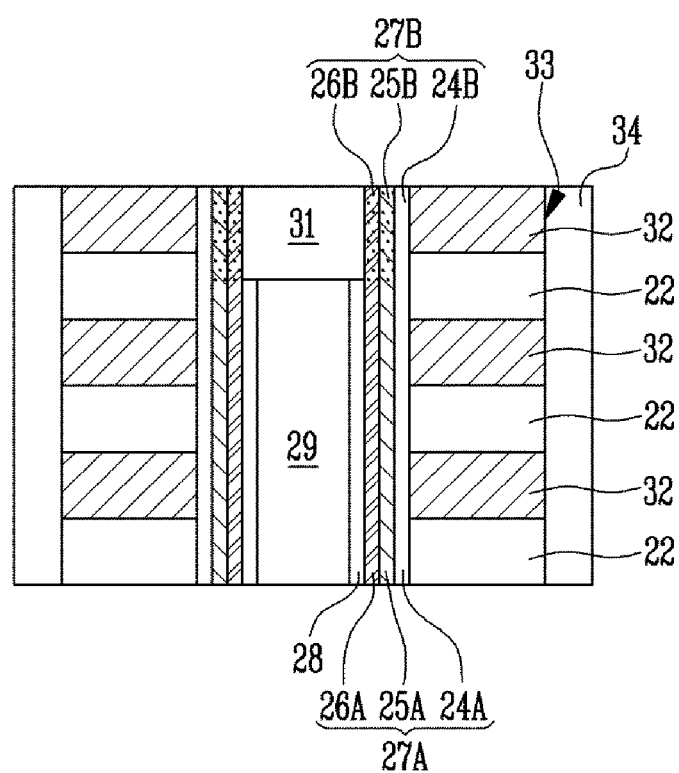

SEMICONDUCTOR DEVICE AND METHOD OF MANUFACTURING THE SAME

CROSS-REFERENCE TO RELATED APPLICATION

The present application claims priority to Korean patent application number 10-2012-0116175 filed on Oct. 18, 2012, in the Korean Intellectual Property Office, the entire disclosure of which is incorporated by reference herein.

BACKGROUND

1. Technical Field

Various embodiments relate generally to a semiconductor memory device and a method of manufacturing the same and, more particularly, to a three-dimensional non-volatile memory device and a method of manufacturing the same.

2. Related Art

A non-volatile memory device retains data stored therein even when not powered. Two-dimensional memory devices in which memory cells are fabricated on a single layer over a silicon substrate have reached physical limits in increasing their degree of integration. Accordingly, three-dimensional (3D) non-volatile memory devices in which memory cells are stacked in a vertical direction over a silicon substrate have been proposed.

A 3D non-volatile memory device includes memory cells and select transistors that are stacked over a substrate. These memory cells include a memory layer to store data. The memory layer may include a tunnel insulating layer, a charge storing layer, and a charge blocking layer.

When a 3D non-volatile memory device is manufactured, memory cells and select transistors are formed concurrently. The select transistors may also include a memory layer that acts as a gate insulating layer. However, when the memory layer is used as the gate insulating layer, a leakage current of the select transistors may increase.

BRIEF SUMMARY

Various embodiments relate to a semiconductor device and a method of manufacturing the same for preventing leakage current of a select transistor and controlling a threshold voltage thereof.

A semiconductor device according to an embodiment of the present invention includes conductive layers and interlayer insulating layers stacked alternately with each other, at least one first channel layer passing through the conductive layers and the interlayer insulating layers, at least one second channel layer coupled to the first channel layers and passing through the conductive layers and the interlayer insulating layers, a first insulating layer interposed between the at least one first channel layer and the conductive layers, and a second insulating layer interposed between the at least one second channel layer and the conductive layers and having a higher nitrogen concentration than the first insulating layer.

A method of manufacturing a semiconductor device according to another embodiment of the present invention includes alternately forming first material layers and second material layers, forming at least one channel hole by etching the first and second material layers, forming a first insulating layer along an inner wall of the at least one channel hole, forming a first channel layer over the first insulating layer, etching the first channel layer to expose a portion of the first insulating layer, nitriding an exposed portion of the first insulating layer, and forming a second channel layer over a nitrided portion of the first insulating layer.

BRIEF DESCRIPTION OF THE DRAWINGS

FIGS. 2A to 2D are cross-sectional views illustrating a process flow for manufacturing a semiconductor device according to another embodiment of the present invention;

DETAILED DESCRIPTION

Figure 1A:
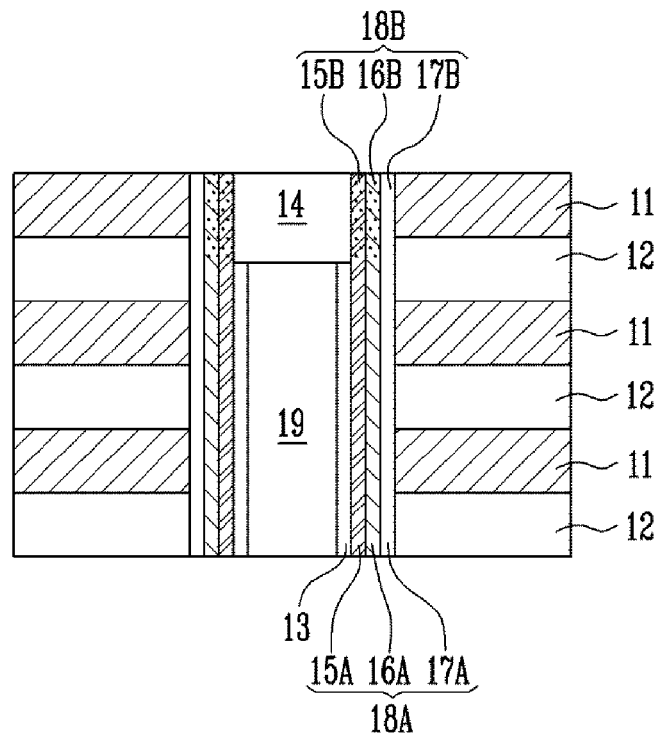
FIGS. 1A to 1C are cross-sectional views of the structure of a semiconductor device according to an embodiment of the present invention.

Hereinafter, various embodiments of the present disclosure will be described in detail with reference to the accompanying drawings. In the drawings, a thickness and a distance of components may be exaggerated compared to an actual physical thickness and interval for convenience of illustration. In the following description, detailed explanations of known related functions and constitutions may be omitted to avoid unnecessarily obscuring the subject manner of the present invention. Like reference numerals refer to like elements throughout the specification and drawings.

Figure 1B:
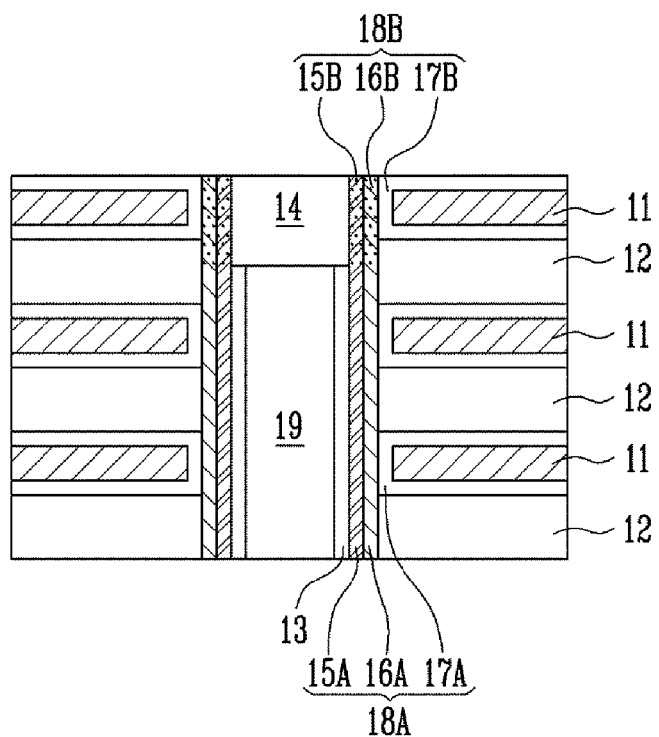
Figure 1C:
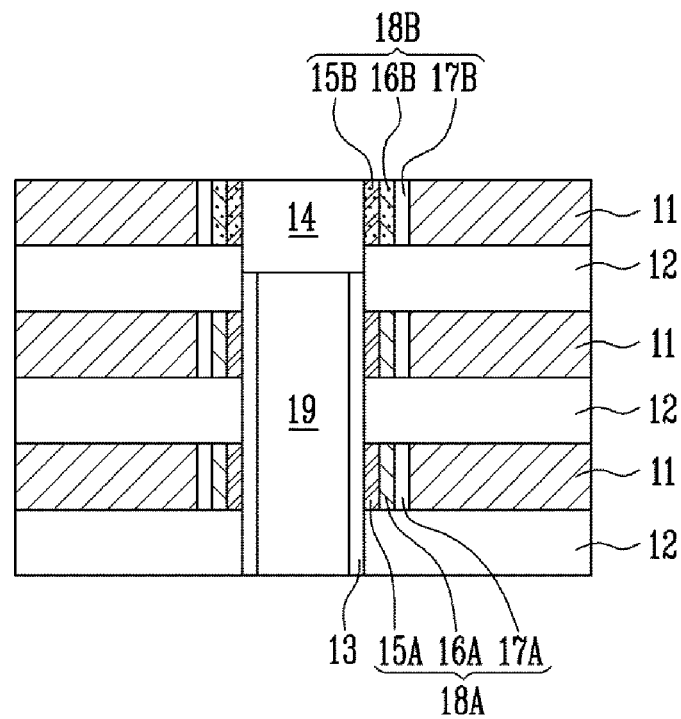

FIGS. 1A to 1C are cross-sectional views of the structure of a semiconductor device according to an embodiment of the present invention.

As illustrated in FIG. 1A, a semiconductor device according to an embodiment of the present invention may include conductive layers 11 and interlayer insulating layers 12, at least one first channel layer 13, at least one second channel layer 14, a first insulating layer 18A, and a second insulating layer 18B. The conductive layers 11 and the interlayer insulating layers 12 may be stacked alternately with each other. The first channel layer 13 may pass through the conductive layers 11 and the interlayer insulating layers 12. The second channel layer 14 may be coupled to the first channel layer 13 and pass through the conductive layers 11 and the interlayer insulating layers 12. The first insulating layer 18A may be interposed between the first channel layer 13 and the alternately stacked conductive layers 11 and interlayer insulating layers 12. The second insulating layer 18B may be interposed between the second channel layer 14 and the alternately stacked conductive layers 11 and interlayer insulating layers 12 and contain a higher nitrogen concentration than the first insulating layer 18A.

Each of the conductive layers 11 may be configured as a word line or a select line. For example, each conductive layer 11 may include a polysilicon layer or a metal layer such as a tungsten layer or a silicide layer. In addition, each of the conductive layers 11 may be of the same or different thickness. For example, one or more of the uppermost conductive layers 11 may be configured as select lines, and the other conductive layers 11 may be configured as word lines. The conductive layer 11 configured as select lines may each have a greater thickness than the conductive layers 11 configured as word lines.

The interlayer insulating layers 12 may insulate stacked word lines or select lines from each other. For example, each of the interlayer insulating layers 12 may comprise a silicon oxide layer or a silicon nitride layer.

The first channel layer 13 may pass through the conductive layers 11 configured as word lines and the interlayer insulating layers 12 interposed therebetween. The first channel layer 13 may be formed in a tubular shape manner having an open central portion or in a pillar shape manner having a central portion completely filled. FIG. 1A particularly illustrates that the first channel layer 13 is formed in a tubular shape manner and is filled with a gap-fill insulating layer 19.

The second channel layer 14 may pass through the conductive layers 11 configured as select lines and the interlayer insulating layers 12 interposed therebetween. The second channel layer 14 may be located on or under the first channel layer 13 and connected to the first channel layer 13 in a single body. Similar to the first channel layer 13, the second channel layer 14 may be formed in a tubular shape manner having an open central portion or in a pillar shape manner having a central portion completely filled. FIG. 1A particularly illustrates that the second channel layer 14 is formed in a pillar shape manner, and in this example, a contact area between the second channel layer 14 and a contact plug (not illustrated) configured as a bit line to be formed by subsequent processes may be increased to thereby reduce contact resistance.

The first insulating layer 18A may be interposed between the first channel layer 13 and the alternately stacked conductive layers 11 configured as word lines and the interlayer insulating layers 12, and may be used as a memory layer of a memory cell. The first insulating layer 18A may surround the first channel layer 13 and may include a tunnel insulating layer, a charge storing layer, and a charge blocking layer. For example, the first insulating layer 18A may include a first tunnel insulating layer 15A surrounding the first channel layer 13, a first charge storing layer 16A surrounding the first tunnel insulating layer 15A, and a first charge blocking layer 17A surrounding the first charge storing layer 16A.

The second insulating layer 18B may be interposed between the second channel layer 14 and the alternately stacked conductive layers 11 configured as select lines and the interlayer insulating layers 12, and may be used as a gate insulating layer of a select transistor. The second insulating layer 18B may surround the second channel layer 14 and may include a tunnel insulating layer, a charge storing layer, and a charge blocking layer. For example, the second insulating layer 18B may include a second tunnel insulating layer 15B surrounding the second channel layer 14, a second charge storing layer 16B surrounding the second tunnel insulating layer 15B, and a second charge blocking layer 17B surrounding the second charge storing layer 16B.

The first and second charge blocking layers 17A and 17B may prevent charge from passing through the first and second charge storing layers 16A and 16B and moving to the conductive layers 11 configured as word lines. Each of the first and second charge blocking layers 17A and 17B may be an oxide layer formed through thermal oxidation or deposition. Each of the first and second tunnel insulating layers 15A and 15B may include an oxide layer such as a silicon oxide layer. The first and second charge storing layers 16A and 16B may be used as an actual data storage that stores data therein. In addition, the first and second charge storing layers 16A and 16B may include at least one of a floating gate formed of a polysilicon layer storing charge, a trap layer including a nitride layer trapping charge, and nanodots. The semiconductor device may also include first and second phase-change material layers instead of the first and second charge storing layers 16A and 16B.

In addition, the first insulating layer 18A and the second insulating layer 18B may be coupled integrally with each other to form a single layer. In this specification, a selectively nitrided portion of a single layer is referred to as the second insulating layer 18B, and the remaining portion of the layer is referred to as the first insulating layer 18A.

The second insulating layer 18B may have a uniform nitrogen concentration or a nitrogen concentration gradient. For example, by controlling a depth at which nitrogen is injected in a horizontal direction during a nitriding process, the second insulating layer 18B may have such a concentration gradient where a nitrogen concentration of the second insulating layer 18B may increase as distance from the second channel layer 14 decreases or may decrease as distance therefrom increases. In another example, a nitrogen concentration at a specific location (e.g., second charge storing layer) may be increased by controlling a range (Rp) where nitrogen is injected.

For example, when nitrogen is injected at a depth corresponding to the second tunnel insulating layer 15B, the second tunnel insulating layer 15B may have a higher nitrogen concentration than the first tunnel insulating layer 15A, and the second charge storing layer 16B and the second charge blocking layer 17B may have substantially similar nitrogen concentrations as the first charge storing layer 16A and the first charge blocking layer 17A, respectively. In another example, when nitrogen is injected at depths from the second tunnel insulating layer 15B to the second charge storing layer 16B, the second tunnel insulating layer 15B may have a higher nitrogen concentration than the first tunnel insulating layer 15A, the second charge storing layer 16B may have a higher nitrogen concentration than the first charge storing layer 16A, and the second charge blocking layer 17B may have a substantially similar nitrogen concentration as the first charge blocking layer 17A. In yet another example, when nitrogen is injected at depths from the second tunnel insulating layer 15B to the second charge blocking layer 17B through the second charge storing layer 16B, the second tunnel insulating layer 15B may have a higher nitrogen concentration than the first tunnel insulating layer 15A, the second charge storing layer 16B may have a higher nitrogen concentration than the first charge storing layer 16A, and the second charge blocking layer 17B may have a higher nitrogen concentration than the first charge blocking layer 17A. In addition, the second charge storing layer 16B may have a higher nitrogen concentration than the second tunnel insulating layer 15B and the second charge blocking layer 17B by controlling the range (Rp) where nitrogen is injected.

Hereinafter, structures of semiconductor devices according to other embodiments of the present invention may be illustrated with reference to FIGS. 1B and 1C. The semiconductor devices as illustrated in FIGS. 1B and 1C may have substantially similar structures with that of the semiconductor device described with reference to FIG. 1A except for positions where the first and second insulating layers 18A and 18B are formed. Therefore, a description of the contents of the semiconductor devices illustrated in FIGS. 1B and 1C that are the same as those of the semiconductor device described with reference to FIG. 1A is omitted. The key difference concerning the first and second insulating layers 18A and 18B will be mainly described.

As illustrated in FIG. 1B, the first insulating layer 18A may include the first tunnel insulating layer 15A, the first charge storing layer 16A, and first charge blocking layer 17A. The first tunnel insulating layer 15A may surround the first channel layer 13. The first charge storing layer 16A may surround the first tunnel insulating layer 15A. The first charge blocking layer 17A may be interposed between the first charge storing layer 16A and the conductive layers 11 and surround top and bottom surfaces of the conductive layers 11.

Similarly, the second insulating layer 18B may include the second tunnel insulating layer 15B, the second charge storing layer 16B, and the second charge blocking layer 17B. The second tunnel insulating layer 15B may surround the second channel layer 14. The second charge storing layer 16B may surround the second tunnel insulating layer 15B. The second charge blocking layer 17B may be interposed between the second charge storing layer 16B and the conductive layers 11 and surround top and bottom surfaces of the conductive layers 11.

As illustrated in FIG. 1C, first insulating layers 18A may be interposed between the first channel layer 13 and the conductive layers 11 configured as word lines and may not be interposed between the first channel layer 13 and the interlayer insulating layers 12. For example, the first insulating layer 18A may include the first tunnel insulating layer 15A, the first charge storing layer 16A, and the first charge blocking layer 17A. The first tunnel insulating layer 15A may surround the first channel layer 13. The first charge storing layer 16A may surround the first tunnel insulating layer 15A. The first charge blocking layer 17A may surround the first charge storing layer 16A.

Similarly, second insulating layers 18B may be interposed between the second channel layer 14 and the conductive layers 11 configured as select lines and may not be interposed between the second channel layer 14 and the interlayer insulating layers 12. For example, each second insulating layer 18B may include the second tunnel insulating layer 15B, the second charge storing layer 16B, and the second charge blocking layer 17B. The second tunnel insulating layer 15B may surround the second channel layer 14. The second charge storing layer 16B may surround the second tunnel insulating layer 15B. The second charge blocking layer 17B may surround the second charge storing layer 16B.

Considering the above-described structures, a threshold voltage of a select transistor may be easily controlled by adjusting a nitrogen concentration of a gate insulating layer. The gate insulating layer of the select transistor may have a higher nitrogen concentration than a memory layer of a memory cell. When the gate insulating layer has a higher nitrogen concentration, the number of trap sites of the gate insulating layer of the select transistor may increase, and therefore, the select transistor may have a higher threshold voltage than the memory cell. As a result, leakage current of the select transistor may be prevented.

FIGS. 2A to 2D are cross-sectional views illustrating a process flow for manufacturing a semiconductor device according to an embodiment of the present invention.

Figure 2A:
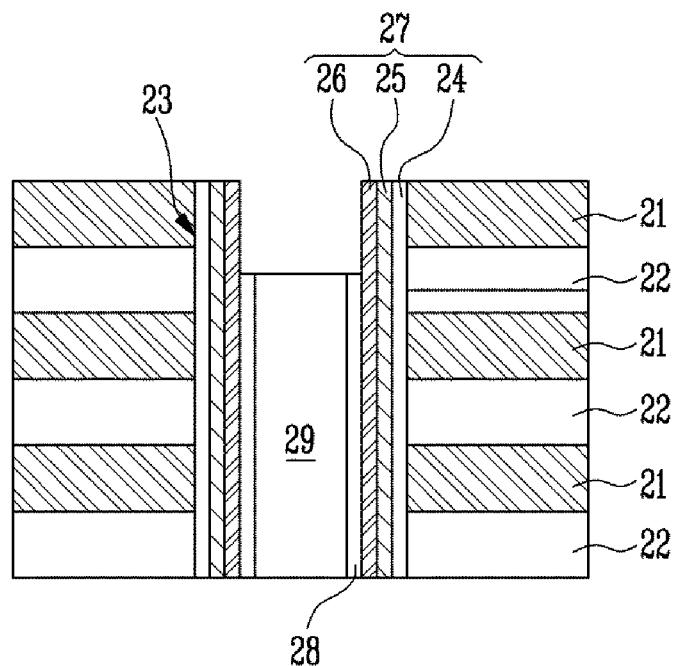

As illustrated in FIG. 2A, first material layers 21 and second material layers 22 may be stacked alternately with each other. The first material layers 21 may be provided to form conductive layers such as word lines and select lines. The second material layers 22 may insulate stacked conductive layers from each other. For example, one or more of the uppermost first material layers 21 may be configured as select lines, and the other first material layers 21 may be configured as word lines. Each of the first material layers 21 configured as select lines may have a thickness greater than or equal to each of the material layers 21 configured as word lines.

For example, each of the first material layers 21 may include a conductive layer such as a polysilicon layer, and each of the second material layers 22 may include an insulating layer such as an oxide layer. In another example, each of the first material layers 21 may include a conductive layer such as a doped polysilicon layer or a doped amorphous silicon layer. Each of the second material layers 22 may include a sacrificial layer such as an undoped polysilicon layer or an undoped amorphous silicon layer. In yet another example, each of the first material layers 21 may include a sacrificial layer such as a nitride layer, and each of the second material layers 22 may include an insulating layer such as an oxide layer.

According to FIG. 2A, a description is made with reference to a case in which the first material layers 21 include sacrificial layers and the second material layers 22 include insulating layers.

Subsequently, the first material layers 21 and the second material layers 22 that are stacked alternately with each other may be etched to form at least one channel hole 23. An insulating layer 27 may then be formed along an inner wall of the channel hole 23. When the insulating layer 27 is formed, at least one of a charge blocking layer 24, a charge storing layer 25, and a tunnel insulating layer 26 may be sequentially formed along the inner wall of the channel hole 23. For example, the charge storing layer 25 and the tunnel insulating layer 26 may be formed along the inner wall of the channel hole 23.

Subsequently, a first channel layer 28 may be formed on the insulating layer 27. For example, the first channel layer 28 may include a polysilicon layer. The first channel layer 28 may be formed in a tubular shape manner having an open central portion. Subsequently, the open central portion of the first channel layer 28 may be filled with a gap-fill insulating layer 29. For example, the gap-fill insulating layer 29 may include an oxide layer.

A portion of the insulating layer 27 may be exposed by etching the gap-fill insulating layer 29 and the first channel layer 28 to a certain depth.

For example, the gap-fill insulating layer 29 and the first channel layer 28 may be etched so that top surfaces of the gap-fill insulating layer 29 and the first channel layer 28 may be higher than a top surface of the first material layer 21 configured as an uppermost word line. Here, the top surfaces of the gap-fill insulating layer 29 and the first channel layer 28 may be higher than a bottom surface of the first material layer 21 configured as a select line so as to partially expose the first material layer 21 configured as a select line.

The gap-fill insulating layer 29 and the first channel layer 28 may be removed by one of, or a combination of dry etching and wet etching. In addition, the gap-fill insulating layer 29 and the first channel layer 28 may be etched simultaneously or separately.

When the first channel layer 28 is formed in a pillar shape manner, a process of forming the gap-fill insulating layer 29 may be skipped. In this example, the first channel layer 28 may be etched to expose the first material layers 21 configured as a select line.

Hereinafter, for illustration purposes, an exposed portion of the insulating layer 27 is referred to as a second insulating layer 27B, and an unexposed portion of the insulating layer 27 is referred to as a first insulating layer 27A. The second insulating layer 27B may include a second charge blocking layer 24B, a second charge storing layer 25B, and a second tunnel insulating layer 26B. In addition, the first insulating layer 27A may include a first charge blocking layer 24A, a first charge storing layer 25A, and a first tunnel insulating layer 26A.

Figure 2B:
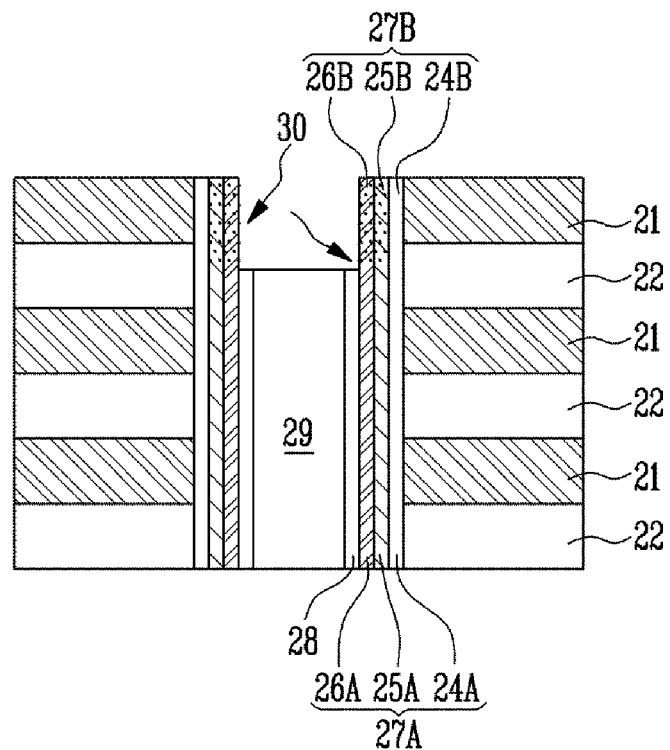

As illustrated in FIG. 2B, the second insulating layer 27B may be nitrided (see reference numeral "30"). During a nitriding process, the first insulating layer 27A may not be exposed since the first insulating layer 27A is covered by the gap-fill insulating layer 29 and the first channel layer 28. Therefore, selective nitridation may be performed to nitride only the second insulating layer 27B, and accordingly the first insulating layer 27A may have the same nitrogen concentration before and after nitridation. Therefore, the second insulating layer 27B may have a higher nitrogen concentration than the first insulating layer 27A.

The difference in nitrogen concentration between the first insulating layer 27A and the second insulating layer 27B may be controlled according to various nitriding processes. For example, the nitriding process may be performed using one of, or a combination of, a plasma nitriding process, a thermal treatment process using nitrogen gases, and an ion injection process using nitrogen ions. In addition, the nitriding process may be performed under a temperature condition ranging from 400° C. to 1000° C. and a pressure condition ranging from 0.1 Torr to 2 Torr and may be performed using one of, or a combination of, $N_2O$ gas, NO gas, and $N_2$ gas.

In addition, during nitridation of the second insulating layer 27B, a depth by which the second insulating layer 27B is nitrided may be controlled according to process conditions. For example, only the second tunnel insulating layer 26B may be nitrided, or both the second tunnel insulating layer 26B and the second charge storing layer 25B may be nitrided. Otherwise, the second tunnel insulating layer 26B, the second charge storing layer 25B, and the second charge blocking layer 24B may all be subject to nitridation.

A diffusion process such as a heat treatment process may be further performed. Nitrogen atoms included in the second insulating layer 27B may be diffused into the first insulating layer 27A by the diffusion process. Therefore, the first insulating layer 27A may be partially nitrided.

Figure 2C:
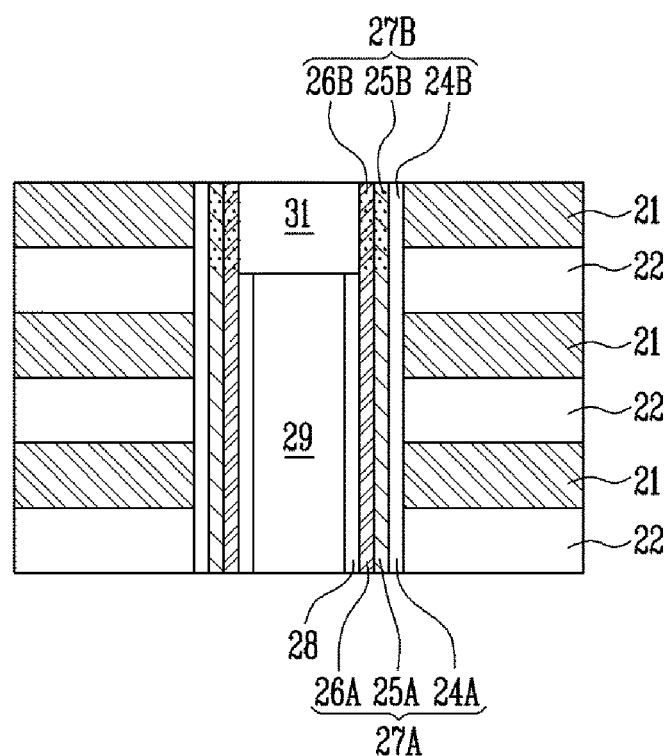

As illustrated in FIG. 2C, a second channel layer 31 may be formed in the channel hole 23. The second channel layer 31 may include a polysilicon layer. The second channel layer 31 may be formed in a tubular shape manner having an open central portion or in a pillar shape manner having a central portion completely filled. FIG. 2C illustrates that the second channel layer 31 is formed in a pillar shape manner.

As illustrated in FIG. 2D, conductive layers 32 may replace the first material layers 21. For example, the first material layers 21 and the second material layers 22 may be etched to form at least one slit 33 between neighboring channel holes 23, and the first material layers 21 exposed through the slit 33 may be etched to form first recessed regions. Subsequently, the conductive layers 32 may be formed in the first recessed regions. Subsequently, the slit 33 may be filled with an insulating layer 34. In this example, an air gap may be formed in the slit 33 by controlling a deposition thickness and a deposition method of the insulating layer 34. As a result, the semiconductor device having the structure as illustrated in FIG. 1A may be manufactured.

Prior to forming conductive layers in the first recessed regions, an insulating layer may be additionally formed along inner surfaces of the first recessed regions. In this example, when the insulating layer is formed, at least one of a charge blocking layer, a charge storing layer, and a tunnel insulating layer may be sequentially formed. The semiconductor device having the structure as illustrated in FIG. 1B may be manufactured by forming another charge blocking layer. The additionally formed charge blocking layer may be formed by stacking an oxide layer and a material layer with a high dielectric constant.

According to the aforementioned processes, a nitrogen concentration of a gate insulating layer of a select transistor may be easily controlled. Therefore, a threshold voltage of the select transistor may be controlled, and leakage current may be prevented.

Various changes may be made to the above-described processes, particularly the processes subsequent to forming the slit 33, according to materials of the first and second material layers 21 and 22.

When the first material layers 21 include conductive layers, and the second material layers 22 include interlayer insulating layers, the slit 33 may be formed, and the first material layers 21 exposed through the slit 33 may be silicided. Subsequently, the insulating layer 34 may be formed in the slit 33.

In another example, when the first material layers 21 include conductive layers, and the second material layers 22 include sacrificial layers, the second material layers 22 exposed through the slit 33 may be removed to form second recessed regions. Subsequently, the first material layers 21 exposed through the slit 33 may be silicided, and an insulating layer may be formed in the second recessed regions. The first and second insulating layers 27A and 27B exposed through the second recessed regions may be etched before the insulating layer is formed in the second recessed regions. Subsequently, the insulating layer 34 may be formed in the slit 33. In this example, the semiconductor device having the structure as illustrated in FIG. 1C may be manufactured.

Figure 3:
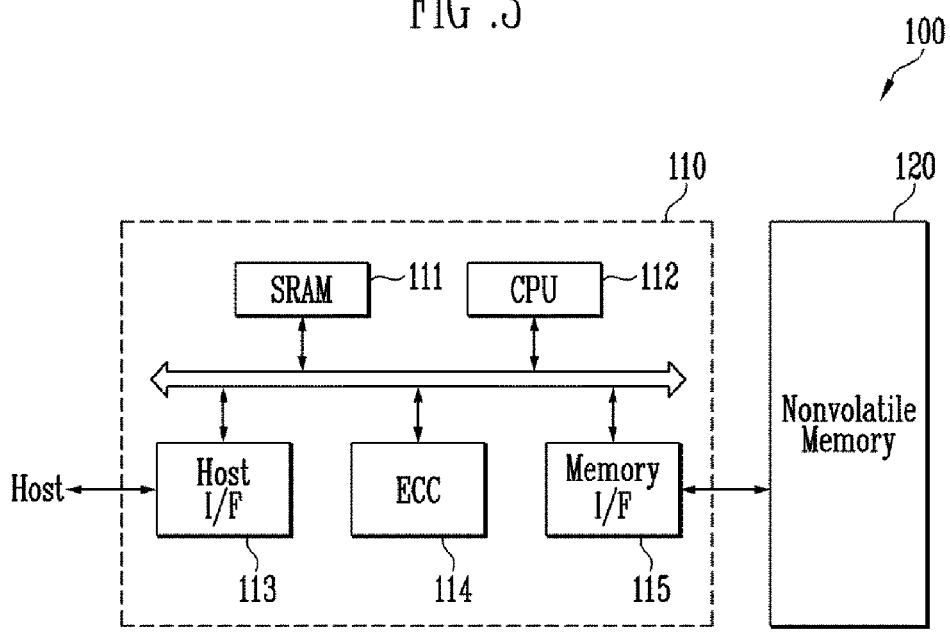
FIG. 3 is a block diagram showing the configuration of a memory system according to another embodiment of the present invention.

FIG. 3 is a block diagram showing the configuration of a memory system according to an embodiment of the present invention.

As illustrated in FIG. 3, a memory system 100 according to an embodiment of the present invention may include a non-volatile memory device 120 and a memory controller 110.

The non-volatile memory device 120 may have the above-described structure. In addition, the non-volatile memory device 120 may be a multi-chip package composed of a plurality of flash memory chips.

The memory controller 110 may be configured to control the non-volatile memory device 120. The memory controller 110 may include an SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include RCM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with an outside source (e.g., a host) through one of the interface protocols including USB, MMC, PCI-E, SATA, PATA, SCSI, ESDI and IDE.

Figure 4:
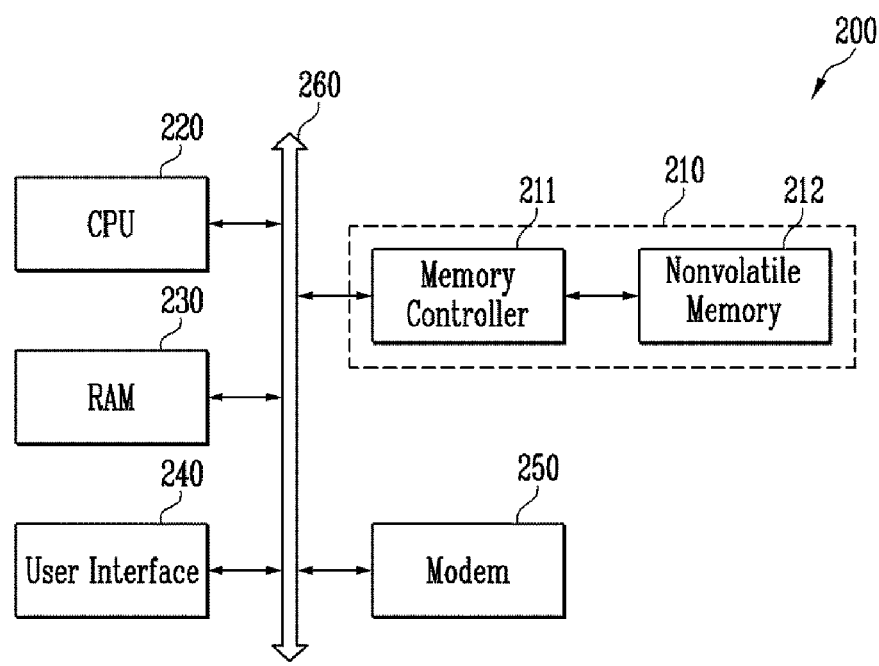
FIG. 4 is a block diagram showing the configuration of a computing system according to another embodiment of the present invention.

FIG. 4 is a block diagram showing the configuration of a computing system according to an embodiment of the present invention.

As illustrated in FIG. 4, a computing system 200 according to an embodiment of the present invention may include a CPU 220, RAM 230, a user interface 240, a modem 250 and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS) and a mobile DRAM.

As described above in connection with FIG. 3, the memory system 210 may include a non-volatile memory 212 and a memory controller 211.

Since a gate insulating layer of a select transistor is selectively nitrided, a threshold voltage of the select transistor may be controlled, and leakage current may be reduced.

What is claimed is:

1. A semiconductor device, comprising: conductive layers and interlayer insulating layers stacked alternately with each other; at least one first channel layer passing through the conductive layers and the interlayer insulating layers; at least one second channel layer disposed on and coupled to the first channel layers and passing through the conductive layers and the interlayer insulating layers; a first insulating layer interposed between the at least one first channel layer and the conductive layers and including nitrogen; and a second insulating layer interposed between the at least one second channel layer and the conductive layers and including nitrogen, wherein the second insulating layer has a higher nitrogen concentration than the first insulating layer, wherein the first insulating layer and the second insulating layer are included in different transistors within the stack.

2. The semiconductor device of claim 1, wherein the first channel layer is a channel layer of memory cells, and the second channel layer is a channel layer of select transistors.

3. The semiconductor device of claim 1, wherein the first insulating layer includes a first tunnel insulating layer, a first charge storing layer, and a first charge blocking layer, and the second insulating layer includes a second tunnel insulating layer, a second charge storing layer, and a second charge blocking layer.

4. The semiconductor device of claim 3, wherein the second charge storing layer has a higher nitrogen concentration than the first charge storing layer.

5. The semiconductor device of claim 3, wherein the second tunnel insulating layer has a higher nitrogen concentration than the first tunnel insulating layer.

6. The semiconductor device of claim 3, wherein the second charge storing layer has a higher nitrogen concentration than the second tunnel insulating layer.

7. The semiconductor device of claim 1, wherein the first channel layer is formed in a tubular shape manner.

8. The semiconductor device of claim 7, further comprising a third insulating layer filling a central portion of the first channel layer.

9. The semiconductor device of claim 1, wherein at least one uppermost conductive layer of the conductive layers is configured as a select line, and remaining conductive layers are configured as word lines.

10. The semiconductor device of claim 9, wherein a top surface of the first channel layer is higher than a top surface of an uppermost conductive layer configured as a word line.

11. The semiconductor device of claim 1, wherein the second channel layer is located on the first channel layer and connected to the first channel layer in a single body.

12. A method of manufacturing a semiconductor device, the method comprising:
alternately forming first material layers and second material layers;
forming at least one channel hole passing through the first and second material layers;
forming a first insulating layer along an inner wall of the at least one channel hole;
forming a first channel layer over the first insulating layer;
etching the first channel layer to expose a portion of the first insulating layer;
nitriding an exposed portion of the first insulating layer; and
forming a second channel layer on a nitrided portion of the first insulating layer.

13. The method of claim 12, further comprising filling the channel hole having the first channel layer formed therein with a third insulating layer.

14. The method of claim 12, wherein at least one uppermost first material layer of the first material layers is configured as a select line, and remaining first material layers are configured as word lines.

15. The method of claim 14, wherein the etching of the first channel layer comprises etching the first channel layer so that a top surface of the first channel layer is higher than a top surface of an uppermost first material layer configured as a word line.

16. The method of claim 12, wherein the forming of the first insulating layer comprises forming at least one of a charge blocking layer, a charge storing layer, and a tunnel insulating layer along the inner wall of the channel hole.

17. The method of claim 12, wherein the nitriding of the exposed portion of the first insulating layer is performed using one of, or a combination of, a plasma nitriding process, a thermal treatment process using nitrogen gases, and an ion injection process using nitrogen ions.

18. The method of claim 17, wherein the nitriding of the exposed portion of the first insulating layer is performed under a temperature condition ranging from 400° C. to 1000° C. and a pressure condition ranging from 0.1 Torr to 2 Torr.

19. The method of claim 12, wherein the nitriding of the exposed portion of the first insulating layer is performed using one of, or a combination of, N2O gas, NO gas, and N2 gas.

20. The semiconductor device of claim 1, wherein the second insulating layer has a nitrogen concentration gradient where the nitrogen concentration of the second insulating layer increases as a distance from the second channel layer decreases.

* * * * *